(12) United States Patent
Son et al.

(10) Patent No.: US 10,446,323 B1
(45) Date of Patent: Oct. 15, 2019

(54) ELECTRONIC COMPONENT HAVING MULTILAYER CAPACITOR, INTERPOSER, AND ADHESIVE LAYER

(71) Applicant: SAMSUNG ELECTRO-MECHANICS CO., LTD., Suwon-si, Gyeonggi-do (KR)

(72) Inventors: Soo Hwan Son, Suwon-si (KR); Ho Yoon Kim, Suwon-si (KR); Sang Soo Park, Suwon-si (KR); Woo Chul Shin, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/189,239

(22) Filed: Nov. 13, 2018

(30) Foreign Application Priority Data

Sep. 6, 2018 (KR) .................. 10-2018-0106554

(51) Int. Cl.
| | |
|---|---|
| *H01G 4/30* | (2006.01) |
| *H01G 2/06* | (2006.01) |
| *H01G 4/232* | (2006.01) |
| *H01G 4/005* | (2006.01) |
| *H05K 1/18* | (2006.01) |
| *H01G 4/12* | (2006.01) |

(52) U.S. Cl.
CPC .............. *H01G 4/30* (2013.01); *H01G 2/06* (2013.01); *H01G 4/005* (2013.01); *H01G 4/1227* (2013.01); *H01G 4/232* (2013.01); *H05K 1/181* (2013.01); *H05K 2201/10378* (2013.01); *H05K 2201/10636* (2013.01)

(58) Field of Classification Search
CPC ............ H01G 2/06; H01G 4/232; H01G 4/30; H05K 2201/10378; H05K 2201/10636
See application file for complete search history.

(56) References Cited

U.S. PATENT DOCUMENTS

| | | | |
|---|---|---|---|
| 2002/0006033 A1* | 1/2002 | Chengalva | H05K 3/303 361/770 |
| 2004/0232550 A1* | 11/2004 | Walker | H05K 3/321 257/746 |

(Continued)

FOREIGN PATENT DOCUMENTS

| | | | |
|---|---|---|---|
| JP | 2013105969 A | * | 5/2013 |
| KR | 10-2016-0055424 A | | 5/2016 |

*Primary Examiner* — David M Sinclair
(74) *Attorney, Agent, or Firm* — Morgan, Lewis & Bockius LLP (57) ABSTRACT

An electronic component includes: a multilayer capacitor including a capacitor body and a pair of external electrodes, an interposer including an interposer body and a pair of external terminals, and an adhesive layer disposed on facing boundaries of the multilayer capacitor and the interposer; wherein the external terminals include bonding portions disposed on a top surface of the interposer body and connected to the external electrodes via the adhesive layer, mounting portions disposed on a bottom surface of the interposer body, and connection portions disposed on end surfaces of the interposer body to connect the bonding portions and the mounting portions to each other; wherein $0.1 \leq t/T \leq 0.3$ in which dimension "t" is a maximum height of the adhesive layer and dimension "T" is a height of the electronic component.

19 Claims, 5 Drawing Sheets

(56) References Cited

U.S. PATENT DOCUMENTS

| | | | |
|---|---|---|---|
| 2014/0268486 A1* | 9/2014 | Hattori | H01G 4/308 361/301.4 |
| 2015/0206661 A1* | 7/2015 | Fujimura | H01G 4/30 361/301.4 |
| 2016/0093439 A1* | 3/2016 | Fujita | H01G 4/228 361/301.4 |
| 2016/0133386 A1 | 5/2016 | Park et al. | |
| 2017/0011857 A1* | 1/2017 | Hattori | H01G 4/40 |
| 2017/0290161 A1* | 10/2017 | Shimura | H01G 4/12 |
| 2017/0373009 A1* | 12/2017 | Yoshida | H05K 1/162 |
| 2018/0158608 A1* | 6/2018 | Fujita | H01G 4/0085 |

* cited by examiner

ELECTRONIC COMPONENT HAVING MULTILAYER CAPACITOR, INTERPOSER, AND ADHESIVE LAYER

CROSS-REFERENCE TO RELATED APPLICATION(S)

This application claims the benefit of priority to Korean Patent Application No. 10-2018-0106554 filed on Sep. 6, 2018 in the Korean Intellectual Property Office, the disclosure of which is incorporated herein by reference in its entirety.

TECHNICAL FIELD

The present disclosure relates to an electronic component.

BACKGROUND

A multilayer capacitor has been used as a component of various electronic devices due to advantages thereof such as compactness and high capacitance.

Such a multilayer capacitor has a structure in which a plurality of dielectric layers and internal electrodes having different polarities are alternately arranged while being interposed between the dielectric layers.

In this case, the dielectric layers have piezoelectric properties. Accordingly, when a direct current (DC) voltage or an alternating current (AC) voltage is applied to the multilayer ceramic capacitor, a piezoelectric phenomenon may occur between the internal electrodes. As a result, the volume of a ceramic body is expanded and contracted depending on a frequency, to cause periodic vibrations.

During board mounting, the vibrations may be transmitted to the board through a solder connecting external electrodes of the multilayer ceramic capacitor to the board. Thus, the entire board may become an acoustic reflective surface to generate a vibration sound to be a noise.

The vibration sound may be in an audible frequency region of 20 Hz to 20,000 Hz, causing listener discomfort. The vibration sound causing listener discomfort is referred to as an acoustic noise.

An electronic component using an interposer disposed between a multilayer capacitor and a board is disclosed as a method of reducing such an acoustic noise.

However, in the case that an electronic component using an interposer decreases in size, a bonding area between a multilayer capacitor and the interposer is reduced to cause difficulty in sufficiently securing fixing strength.

Accordingly, there is need for a technique to secure fixing strength between a multilayer capacitor and an interposer of a certain level or higher while effectively reducing acoustic noise of the multilayer capacitor.

SUMMARY

An aspect of the present disclosure is to provide an electronic component having fixing strength secured therein between a multilayer capacitor and an interposer while maintaining an acoustic-noise reduction effect in a certain level or higher.

According to an aspect of the present disclosure, an electronic component includes a multilayer capacitor, including a capacitor body, and a pair of external electrodes disposed on both ends of the capacitor body, respectively, an interposer, including an interposer body, and a pair of external terminals disposed on both ends of the interposer body, respectively, and an adhesive layer disposed on facing boundaries of the multilayer capacitor and the interposer. The external terminals include bonding portions disposed on a top surface of the interposer body and connected to the external electrodes via the adhesive layer, mounting portions disposed on a bottom surface of the interposer body, and connection portions disposed on end surfaces of the interposer body to connect the bonding portions and the mounting portions to each other. When dimension "t" is a maximum height of the adhesive layer and dimension "T" is a height of the electronic component, t/T satisfies $0.1 \leq t/T \leq 0.3$.

The capacitor body may have a length of 1.0 millimeter, t may ranges from 70 micrometers to 100 micrometers, and t/T may satisfy $0.10 \leq t/T \leq 0.14$.

The capacitor body may have a length of 0.7 millimeter, t may range from 60 micrometers to 90 micrometers, and t/T may satisfy $0.13 \leq t/T \leq 0.20$.

The capacitor body may have a length of 0.5 millimeter, t may range from 50 micrometers to 80 micrometers, and t/T may satisfy $0.17 \leq t/T \leq 0.27$.

The adhesive layer may be disposed between a bottom surface of the capacitor body and a top surface of the interposer body.

The adhesive layer may include an epoxy resin.

The external terminals may have end portions having '[' and ']' shapes.

The interposer body may include alumina.

The capacitor body may include first and second surfaces opposing each other in a first direction, third and fourth surfaces opposing each other in a second direction and connected to the first and second surfaces, and fifth and sixth surfaces opposing each other in a third direction and connected to the first and second surfaces as well as the third and fourth surfaces, the capacitor body including a plurality of dielectric layers and a plurality of first and second internal electrodes alternately disposed with the dielectric layers interposed therebetween in the first direction. One end of each of the plurality of first internal electrodes and one end of each of the plurality of second internal electrodes may be exposed through the third surface and the fourth surface, respectively.

The pair of external electrodes may include head portions disposed on the third and fourth surfaces of the capacitor body, respectively, and band portions extending from the head portions to portions of the first, second, fifth, or sixth surface of the capacitor body.

The adhesive layer may extends to cover the band portions disposed on both sides of a bottom surface of the capacitor body and may extend to cover the bonding portions disposed on both sides of the top surface of the interposer body.

The ceramic body may include an active region in which capacitance is formed by including the plurality of first and second internal electrodes, and a cover region disposed on both side surfaces of the active region in the third direction and disposed on upper and lower surfaces of the active portion in the first direction.

Lengths of the interposer body in the second and third directions may be less than or equal to lengths of the capacitor body in the second and third directions, respectively.

The electronic component may further include a plating layer disposed on surfaces of the external electrodes and surfaces of the external terminals.

The electronic component may have a length of 0.8 millimeter or less, a width of 0.4 millimeter or less, and a height of 0.7 millimeter or less.

According to another aspect of the present disclosure, an electronic component includes a multilayer capacitor, including a capacitor body, and a pair of external electrodes disposed on both ends of the capacitor body, respectively, an interposer, including an interposer body, and a pair of external terminals disposed on both ends of the interposer body, respectively, and an adhesive layer disposed on facing boundaries of the multilayer capacitor and the interposer. The multilayer capacitor may have a concave surface facing the interposer, and the adhesive layer is disposed between the concave surface of the multilayer capacitor and the interposer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

The present disclosure may, however, be embodied in many different forms and should not be construed as being limited to the embodiments set forth herein.

Rather, these embodiments are provided so that this disclosure will be thorough and complete, and will fully convey the scope of the preset disclosure to those skilled in the art.

In the drawings, the shapes and dimensions of elements may be exaggerated for clarity.

The same reference numerals will be used throughout to designate the same or like elements.

Terms used in the present specification are for explaining the embodiments rather than limiting the present disclosure. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

In the specification, directions will be defined to clearly describe exemplary embodiments in the present disclosure. In drawings, X, Y, and Z will denote a length direction, a width direction, and a thickness direction of a multilayer capacitor and an interposer, respectively.

In exemplary embodiments, the Z direction may be used to have the same concept as a direction in which a dielectric layer is laminated.

Figure 1:
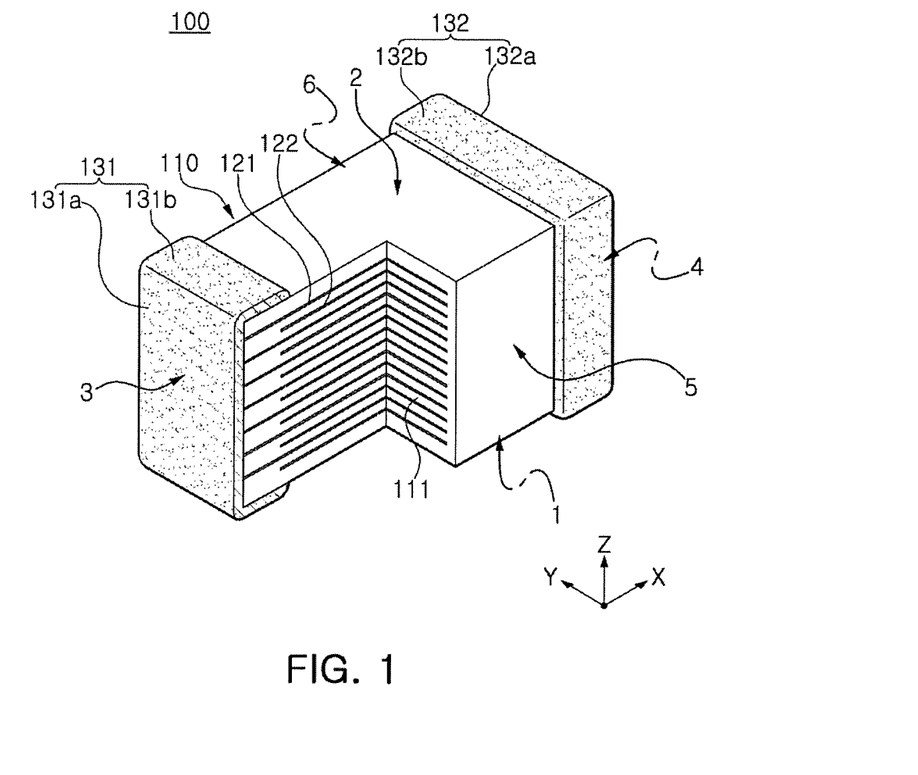
FIG. 1 is a partially cut perspective view of a multilayer capacitor applied to an electronic component in the present disclosure.
Figure 2A:
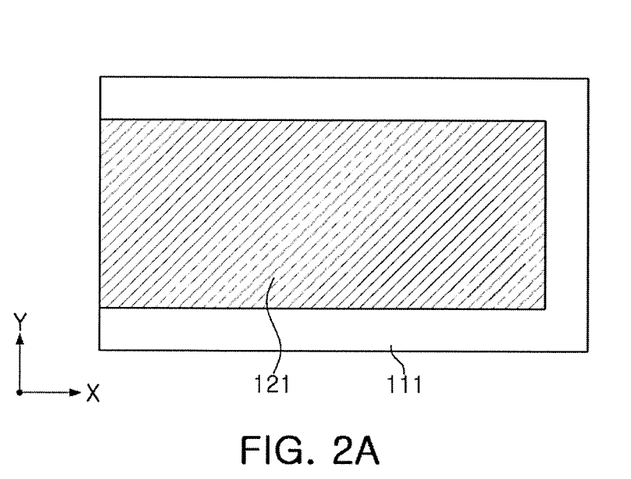
FIGS. 2A and 2B are plan views of a first internal electrode and a second internal electrode of the multilayer capacitor in FIG. 1, respectively.
Figure 2B:
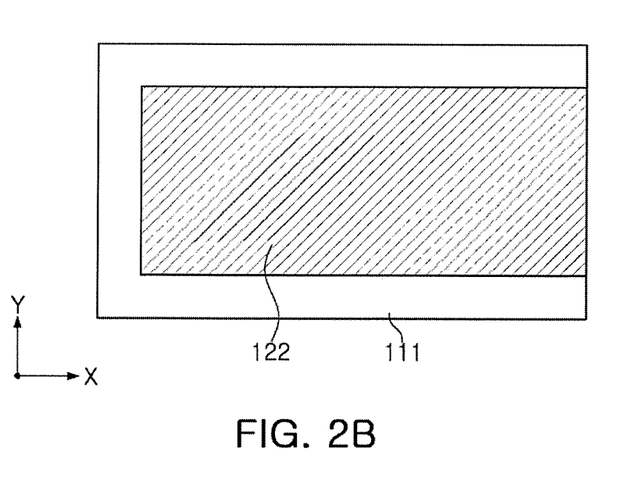

FIG. 1 is a partially cut perspective view of a multilayer capacitor applied to an electronic component in the present disclosure, and FIGS. 2A and 2B are plan views of a first internal electrode and a second internal electrode of the multilayer capacitor in FIG. 1, respectively.

Hereinafter, a structure of a multilayer capacitor applied to an electronic component according to an exemplary embodiment will be described with reference to FIGS. 1 to 2B.

A multilayer capacitor 100 includes a capacitor body 110 and first and second external electrodes 131 and 132 respectively disposed on both ends in X direction of the capacitor body 110.

The capacitor body 110 is formed by laminating a plurality of dielectric layers 111 in Z direction and sintering the laminated dielectric layers 111. Adjacent dielectric layers 111 may be integrated with each other such that boundaries therebetween may not be readily apparent without using a scanning electron microscope (SEM).

In addition, the capacitor body 110 includes first and second internal electrodes 121 and 122 having different polarities. The first and second electrodes 121 and 122 are alternately arranged with the plurality of dielectric layers 111 in the Z direction while being interposed between the dielectric layers 111.

The capacitor body 110 may include an active region as a portion contributing to formation of capacitance of the multilayer capacitor 110 and a cover region as a margin portion prepared in both side portions of the capacitor body 110 in Y direction and prepared in upper and lower portions of the active region in the Z direction.

The capacitor body 110 is not limited in shape, but may have a hexahedral shape. The capacitor body 110 may include first and second surfaces 1 and 2 disposed to oppose each other in the Z direction, third and fourth surfaces 3 and 4 connected to the first and second surfaces 1 and 2 and disposed to oppose each other in the X direction, and fifth and sixth surfaces 5 and 6 connected to the first and second surfaces 1 and 2 as well as the third and fourth surfaces 3 and 4 and disposed to oppose each other.

The dielectric layer 111 may include a ceramic powder, for example, a barium titanate ($BaTiO_3$)-based ceramic powder or the like.

The $BaTiO_3$-based ceramic powder may be $(Ba1-xCax)TiO_3$, $Ba(Ti1-yCay)O_3$, $(Ba1-xCax)(Ti1-yZry)O_3$, or $Ba(Ti1-yZry)O_3$ in which calcium (Ca) or zirconium (Zr) is partially employed in $BaTiO_3$, but a material of the ceramic powder is not limited thereto.

In addition to the ceramic powder, a ceramic additive, an organic solvent, a plasticizer, a binders, and a dispersant may be further added to the dielectric layer 111.

The ceramic additive may include, for example, a transition metal oxide or a transition metal carbide, a rare earth element, magnesium (Mg), aluminum (Al), or the like.

The first and second internal electrodes 121 and 122, as electrodes applied with different polarities, may be disposed on the dielectric layer 111 to be laminated in the Z direction. The first and second internal electrodes 121 and 122 may be alternately arranged to oppose each other with a single dielectric layer 111 interposed therebetween inside the capacitor body 110 in Y direction.

In this case, the first and second internal electrodes 121 and 122 may be electrically insulated from each other by the dielectric layer 111 disposed in the middle thereof.

While a structure in which internal electrodes are laminated in the Z direction has been described in the present disclosure, the present disclosure is not limited to the structure. If necessary, the present disclosure may be applied to a structure in which internal electrodes are laminated in the Y direction.

Ends of the first and second internal electrodes 121 and 122 may be exposed through the third and fourth surfaces 3 and 4 of the capacitor body 110, respectively.

The ends of the first and second electrodes 121 and 122 alternately exposed through the third and fourth surfaces 3 and 4 of the capacitor body 110 may be connected to the first and second external electrodes 131 and 132 disposed on both ends in the X direction of the capacitor body 110, which will be described later, to be electrically connected thereto, respectively.

According to the above-described configuration, charges are accumulated between the first and second internal electrodes 121 and 122 when a predetermined voltage is applied to the first and second external electrodes 131 and 132.

In this case, capacitance of the multilayer capacitor 100 may be proportional to an overlapping area between the first and second internal electrodes 121 and 122 overlapping each other in the active region in the Y direction.

The first and second inner electrodes 121 and 122 may be formed using a conductive paste formed of at least one of a noble metal material such as platinum (Pt), palladium (Pd), and a palladium-silver (Pd—Ag) alloy, nickel (Ni), and copper (Cu), but a material thereof is not limited thereto.

The conductive paste may be printed by means of a screen printing method, a gravure printing method, or the like, but the printing method is not limited thereto.

In the present embodiment, an internal electrode of the capacitor body 110 is shown as being laminated in a direction perpendicular to the first surface 1 which is a mounting surface. However, an internal electrode of the present disclosure may be laminated in a direction horizontal to the mounting surface, if necessary.

The first and second external electrodes 131 and 132 may be provided with voltages having different polarities and may be disposed on both ends in the X direction of the capacitor body 110. The first and second external electrodes 131 and 132 may be respectively connected to exposed ends of the first and second internal electrodes 121 and 122 to be electrically connected to each other.

The first external electrode 131 may include a first head portion 131a and a first band portion 131b.

The first band portion 131a is disposed on the third surface 3 of the capacitor body 110 and is in contact with an end exposed outwardly of the first internal electrode 121 through the third surface 3 of the capacitor body 110 to electrically connect the first internal electrode 121 to the first external electrode 131.

The first band portion 131b is a portion extending from the first head portion 131a to portions of the first, second, fifth, and sixth surfaces 1, 2, 5, and 6 of the capacitor body 110 to improve fixing strength or the like.

The second external electrode 132 may include a second head portion 132a and a second band portion 132b.

The second head portion 132a is disposed on the fourth surface 4 of the capacitor body 110 and is in contact with an end exposed outwardly of the second internal electrode 122 through the fourth surface 4 of the capacitor body 110 to electrically connect the second internal electrode 122 to the second external electrode 132.

The second band portion 132b is a portion extending from the head portion 132a to portions of the first, second, fifth, and sixth surfaces 1, 2, 5, and 6 of the capacitor body 110 to improve fixing strength or the like.

The first and second external electrodes 131 and 132 may further include a plating layer.

The plating layer may include first and second nickel (Ni) plating layers and first and second tin (Sn) plating layers covering the first and second nickel plating layers, respectively.

Figure 3:
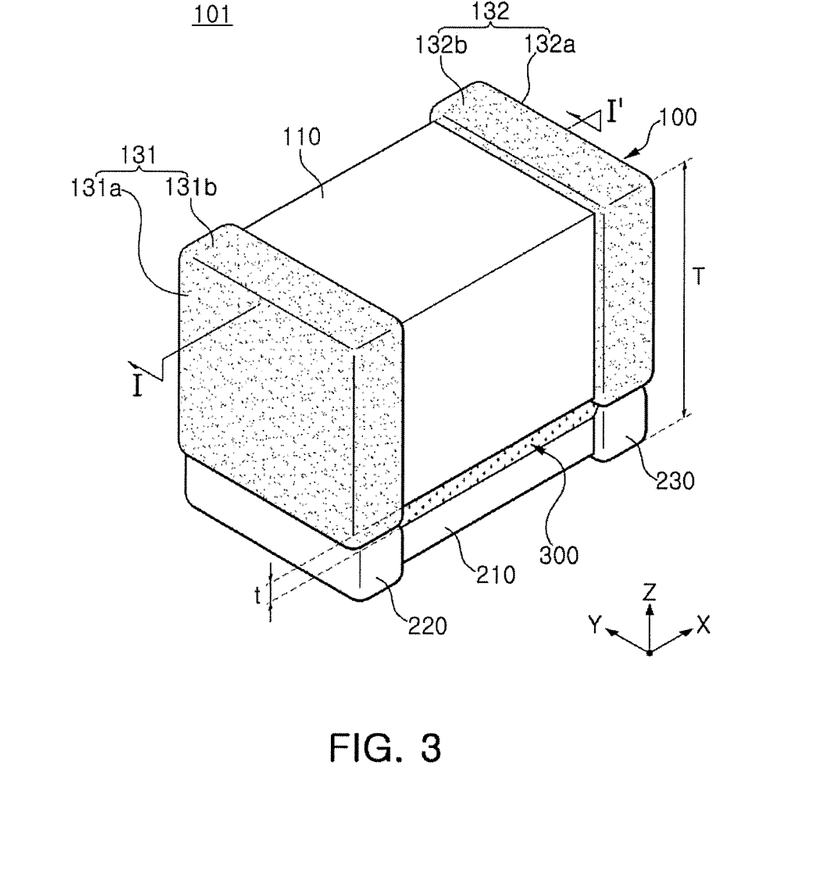
FIG. 3 is a perspective view of an electronic component according to an exemplary embodiment in the present disclosure.
Figure 4:
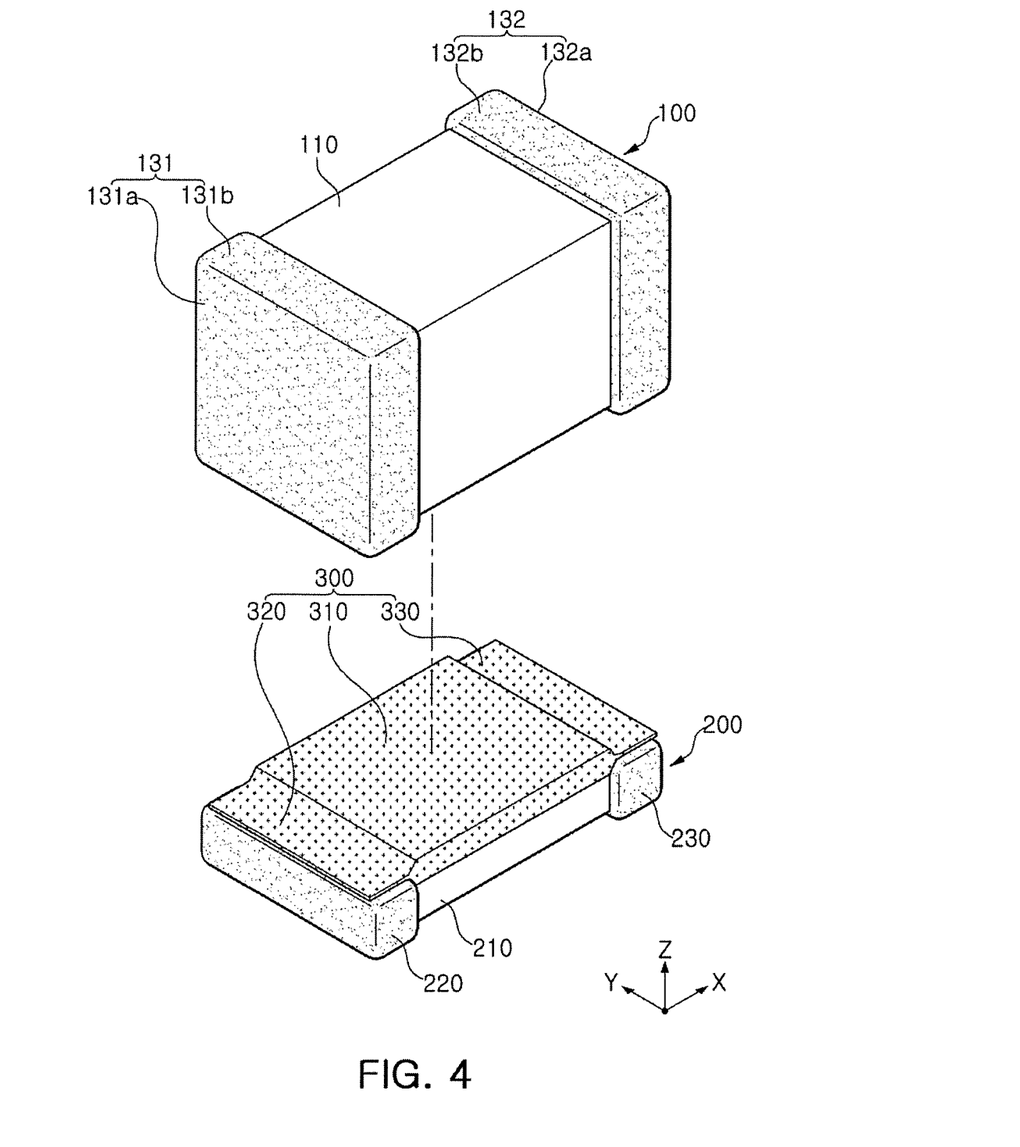
FIG. 4 is an exploded perspective view of FIG. 3.

FIG. 3 is a perspective view of an electronic component according to an exemplary embodiment in the present disclosure. FIG. 4 is an exploded perspective view of FIG. 3, and FIG. 5 is a cross-sectional view taken along line I-I' in FIG. 3.

Figure 5:
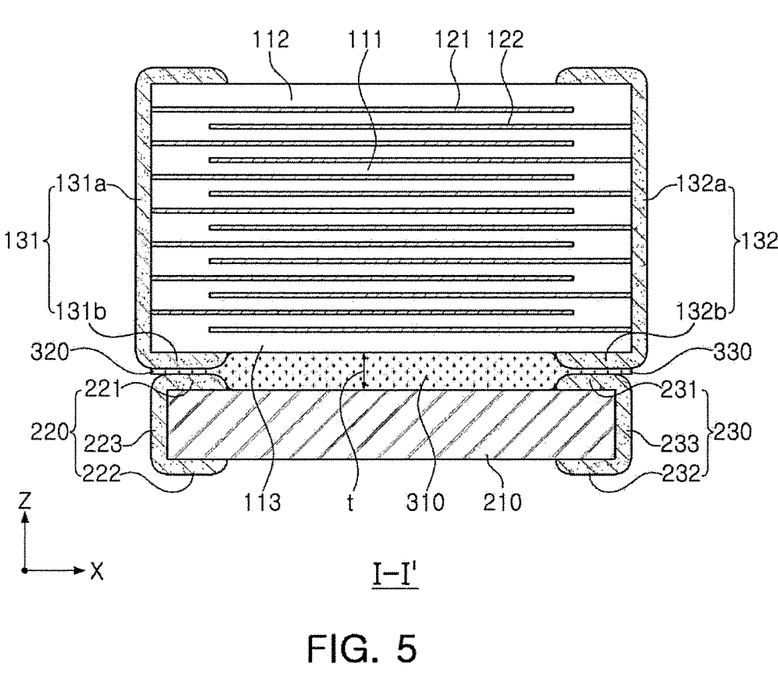
FIG. 5 is a cross-sectional view taken along line I-I' in FIG. 3.

Referring to FIGS. 3 to 5, an electronic component 101 according to an exemplary embodiment includes a multilayer capacitor 100 and an interposer 200.

The electronic component 101 may have an X-direction length of 0.8 millimeter (mm) or less, a Y-direction width of 0.4 mm or less, and a Z-direction height of 0.7 mm or less.

The interposer 200 includes an interposer body 210 and first and second external terminals 220 and 230 respectively disposed on both ends in the X direction of the interposer body 210.

The interposer body 210 is formed of ceramic. In detail, the interposer body 210 may be formed of alumina ($Al_2O_3$).

An X-direction length and a Y-direction width of the interposer body 210 may be less than or equal to those of the capacitor body 110.

The first and second external terminals 220 and 230 may be provided with voltages having different polarities and may be respectively connected to the first and second band portions 131b and 132b of the first and second external electrodes 131 and 132 to be electrically connected to each other.

The first external terminal 220 includes a first bonding portion 221, a first mounting portion 222, and a first connection portion 223.

The first bonding portion 221 is disposed on a top surface of the interposer body 210 and has one end exposed through one surface in the X direction of the interposer body 210 and connected to the first band portion 131b of the first external electrode 131.

The first mounting portion 222 is disposed on a bottom surface of the interposer body 210 to face the first boding portion 221 in the Z direction and may serve as a terminal during board mounting.

The first connection portion 223 is disposed on an end surface in the X direction of the interposer body 210 and serves to bond an end of the first bonding portion 221 and an end of the first mounting portion 222 to each other.

Accordingly, the first external terminal 220 may be disposed to have a [-shaped X-Z end surface.

The first connection portion 223 may be disposed to extend to both end surfaces in the Y direction of the interposer body 210, if necessary.

The second external terminal 230 includes a second bonding portion 231, a second mounting portion 232, and a second connection portion 233.

The second bonding portion 231 is a portion disposed on a top surface of the interposer body 210 and has an end exposed through the other surface in the X direction of the interposer body 210 and connected to the second band portion 132b of the second external electrode 132.

The second mounting portion 232 may be disposed on the bottom surface of the interposer body 210 to face the second bonding portion 231 in the Z direction and may serve as a terminal during board mounting.

The second connection portion 233 is disposed on the other end surface in the X direction of the interposer body 210 and serves to electrically connect an end of the second bonding portion 231 to an end of the second mounting portion 232.

Accordingly, the first external terminal 220 may be disposed to have a ]-shaped X-Z end surface.

The second connection portion 233 may be disposed to extend to both end surfaces in the Y direction of the interposer body 210, if necessary.

A plating layer may be further disposed on surfaces of the first and second external terminals 220 and 230, if necessary.

The plating layer may include a nickel plating layer and a tin plating layer covering the nickel plating layer.

An adhesive layer 300 is disposed on boundaries, facing each other in the Z direction, of the multilayer capacitor 100 and the interposer 200.

The adhesive layer 300 may be disposed between a bottom surface of the capacitor body 110 and a top surface of the interposer body 210.

In this case, when a maximum height of the adhesive layer 300 is defined as t and a height of the electronic component 101 is defined as T, t/T may satisfy $0.1 \leq t/T \leq 0.3$. An electronic component of the present embodiment may optimize acoustic noise reduction effect and securing of fixing strength may be optimized when t/T satisfies the above range.

The adhesive layer 300 may be formed of an epoxy resin.

The adhesive layer 300 may include portions 320 and 330 extending from a portion 310 disposed on a bottom surface of the capacitor body 110 to cover the first and second band portions 131b and 132b of the first and second external electrodes 131 and 132 respectively disposed on both sides of the bottom surface of the capacitor body 110.

Also the adhesive layer 300 may include portions 320 and 330 extending from a portion 310 disposed on a top surface of the interposer body 210 to cover the first and second bonding portions 221 and 231 of the first and second external terminals 220 and 230 respectively disposed on both sides of the top surface of the capacitor body 110.

The adhesive layer 300 may serve to further improve the acoustic noise reduction effect and may enhance bonding strength between the multilayer capacitor 100 and the interposer 200 to improve fixing strength. Thus, poor mounting may be prevented during board mounting.

In detail, the fixing strength may be improved more effectively when an X-direction length of an electronic component is 1.0 mm or less.

When voltages having different polarities are applied to the first and second external electrodes 131 and 132 disposed in the electronic component 100 while the electronic component 100 is mounted on the board, the capacitor body 110 is expanded and contracted in the Z direction by inverse piezoelectric effect of the dielectric layer 111.

Both ends of the first and second external electrodes 131 and 132 are expanded and contracted by the Poisson effect in contrast to expansion and contraction in the Z direction of the capacitor body 110, resulting in generation of vibration.

The vibration is transferred to the board through the first and second external electrodes 131 and 132 and the first and second external terminals 220 and 230. Accordingly, an acoustic is emitted to cause acoustic noise.

In the present embodiment, the interposer 200 is attached to a first surface side that is a direction in which the multilayer capacitor 100 is mounted. Accordingly, the interposer 200 may serve as prevent the vibration of the multilayer capacitor 100 from transferring to the board to reduce the acoustic noise of the multilayer capacitor 100.

In the present embodiment, an adhesive layer 300 is disposed between the multilayer capacitor 100 and the interposer 200. A multilayer capacitor and an interposer are coupled to each other by the adhesive layer 300.

The adhesive layer 300 includes portions 320 and 330 extending to cover a pair of first and second band portions 131b and 132b disposed on both sides of the bottom surface of the capacitor body 110. Since the portions 320 and 330 cover a pair of bonding portions 221 and 231 respectively disposed on both sides of the top surface of the interposer body 210, there is no need for a separate solder or the like to bond an external electrode and an external terminal to each other.

Since the fixing strength between the multilayer capacitor 100 and the interposer 200 is reduced as the multilayer capacitor 100 decreases in size, there may be possibility that the multilayer capacitor 100 and the interposer 200 are unexpectedly separated from each other by poor mounting or dropping impact after the electronic component 101 is mounted on a board.

The greater the amount of the epoxy resin forming the adhesive layer 300, the more the adhesive strength is advantageous. However, since the amount of vibration transferred from the multilayer capacitor 100 increases when the amount of the epoxy resin is too great, acoustic noise is disadvantageously generated.

Accordingly, there is need to find an appropriate size of the adhesive layer 300 to effectively reduce acoustic noise of the electronic component 101 and to sufficiently secure fixing strength between the multilayer capacitor 100 and the interposer 200.

In the present embodiment, a maximum size of the adhesive layer 300 disposed between the capacitor body 110 and the interposer 210 is proposed as the appropriate size of the adhesive layer 300.

Experimental Example

Table (1) shows fixing strength of the electronic component 101 depending on a ratio of the maximum height of the adhesive to the height of the electronic component 101.

A multilayer capacitor 100 used in the Table (1) is fabricated to have an X-direction length of 1.0 mm.

An interposer 200 having substantially the same length and width as the multilayer capacitor 100 and the multilayer capacitor 100 are bonded to each other by an adhesive layer 300 using an epoxy resin to fabricate an electronic component 101. The electronic component 101 is mounted on a board to test fixing strength of the electronic component 101. In this case, amounts of an epoxy resin vary for each sample.

The amounts of an epoxy resin used in each sample may be compared with each other, based on a maximum height of the adhesive layer 300 between a capacitor body 110 and an interposer body 210, using an X-Z cross-sectional image of the electronic component 101.

The fixing strength may be confirmed as strength at the moment when the multilayer capacitor 100 is separated from the interposer 200 by increasingly applying force to one surface of X-Y of the electronic component 101 mounted on the board.

In the Table (1), T denotes the height of the electronic component 101 and t denotes the maximum height of the adhesive layer 300.

The Table (1) shows a result of fixing strength and a result of acoustic noise. With regard to the fixing strength, a case in which the electronic component 101 withstood up to strength of 10 N was determined to be "passing." A case in which acoustic noise was 27 dBA or less was determined to be "passing."

TABLE 1

| # | t (μm) | t/T | Fixing Strength (N) | A/N (dBA) |
|---|---|---|---|---|
| 1 | 0 | 0.00 | 4.5 | 33 |
| 2 | 30 | 0.04 | 6 | 30 |
| 3 | 50 | 0.07 | 7 | 28 |
| 4 | 70 | 0.10 | 10 | 26 |
| 5 | 100 | 0.14 | 11 | 26 |
| 6 | 140 | 0.20 | 11 | 28 |
| 7 | 190 | 0.27 | 11 | 31 |
| 8 | 260 | 0.37 | 11 | 30 |

Referring to the Table (1), in the case of samples 1 to 3 in which a maximum height of an adhesive layer was 70 μm or less, fixing strength between the multilayer capacitor and the interposer was not secured sufficiently. Thus, the multilayer capacitor was separated at strength of 10 N or less.

In the case of samples 6 to 8 in which t/T was more than 0.14, a size of the adhesive layer was so large that acoustic noise was increased again, compared with a sample 5.

Accordingly, to secure a certain level of fixing strength between the multilayer capacitor and the interposer and expect acoustic noise reduction effect, t should range from 70 μm to 100 μm and t/T should satisfy $0.10 \leq t/T \leq 0.14$.

A multilayer capacitor used in Table (2) was fabricated to have an X-direction length of 0.7 mm and the rest are the same as shown in the Table (1).

The Table (2) shows a result of fixing strength and a result of acoustic noise. With regard to the fixing strength, a case in which the electronic component 101 withstood up to strength of 7.1 N was determined to be "passing." A case in which acoustic noise is 26 dBA or less was determined to be "passing."

TABLE 2

| # | t (μm) | t/T | Fixing Strength (N) | A/N (dBA) |
|---|---|---|---|---|
| 11 | 0 | 0.00 | 3.8 | 31 |
| 22 | 20 | 0.04 | 6 | 28 |
| 13 | 40 | 0.09 | 6.3 | 27 |
| 14 | 60 | 0.13 | 7.1 | 25 |
| 15 | 90 | 0.20 | 7.2 | 26 |
| 16 | 120 | 0.27 | 6.8 | 26 |
| 17 | 150 | 0.33 | 7.1 | 27 |
| 18 | 210 | 0.47 | 6.9 | 26 |

Referring to the Table (2), in the case of samples 11 to 13 in which a maximum height of an adhesive layer was 60 μm or less, fixing strength between the multilayer capacitor and the interposer was not secured sufficiently. Thus, the multilayer capacitor was separated at strength less than 7.1.

In the case of samples 16 to 18 in which t/T was more than 0.20, a size of an adhesive layer was so large so acoustic noise reduction effect was not obtained, compared with a sample 15.

Accordingly, to secure a certain level of fixing strength between the multilayer capacitor and the interposer and expect acoustic noise reduction effect, t should range from 60 μm to 90 μm and t/T should satisfy $0.13 \leq t/T \leq 0.20$.

A multilayer capacitor used in Table (3) was fabricated to have an X-direction length of 0.5 mm and the rest are the same as shown in the Table (1).

The Table (3) shows a result of fixing strength and a result of acoustic noise. With regard to the fixing strength, a case in which the electronic component 101 withstood up to strength of 6.5 N was determined to be "passing." A case in which acoustic noise was 28 dBA or less was determined to be "passing."

TABLE 3

| # | t (μm) | t/T | Fixing Strength (N) | A/N (dBA) |
|---|---|---|---|---|
| 21 | 0 | 0.00 | 3.5 | 32 |
| 22 | 20 | 0.07 | 5.9 | 30 |
| 23 | 35 | 0.12 | 6.3 | 28 |
| 24 | 50 | 0.17 | 7.2 | 27 |
| 25 | 80 | 0.27 | 6.5 | 28 |
| 26 | 120 | 0.40 | 7.1 | 29 |
| 27 | 130 | 0.43 | 6.8 | 28 |
| 28 | 170 | 0.57 | 6.9 | 28 |

Referring to the Table (3), in the case of samples 21 to 23 in which a maximum height of an adhesive layer was 50 μm or less, fixing strength between the multilayer capacitor and the interposer was not secured sufficiently. Thus, the multilayer capacitor was separated at strength less than 7.2.

In the case of samples 26 to 28 in which t/T was more than 0.27, a size of an adhesive layer was so large so acoustic noise reduction effect was not obtained, compared with a sample 25.

Accordingly, to secure a certain level of fixing strength between the multilayer capacitor and the interposer and expect acoustic noise reduction effect, t should range from 50 μm to 80 μm and t/T should satisfy $0.17 \leq t/T \leq 0.27$.

As described above, according to an exemplary embodiment, fixing strength between a multilayer capacitor and an interposer may be secured in a certain level while maintaining an acoustic-nose reduction effect in the certain level or higher.

While exemplary embodiments have been shown and described above, it will be apparent to those skilled in the art that modifications and variations could be made without departing from the scope of the present invention as defined by the appended claims.

What is claimed is:

1. An electronic component comprising:
  a multilayer capacitor, including a capacitor body, and a pair of external electrodes disposed on both ends of the capacitor body, respectively;
  an interposer, including an interposer body, and a pair of external terminals disposed on both ends of the interposer body, respectively; and
  an adhesive layer disposed on facing boundaries of the multilayer capacitor and the interposer,
  wherein the external terminals include bonding portions disposed on a top surface of the interposer body and connected to the external electrodes via the adhesive layer, mounting portions disposed on a bottom surface of the interposer body, and connection portions disposed on end surfaces of the interposer body to connect the bonding portions and the mounting portions to each other, and
  wherein $0.1 \leq t/T \leq 0.3$ in which dimension "t" is a maximum height of the adhesive layer and dimension "T" is a height of the electronic component.

2. The electronic component of claim 1, wherein the capacitor body has a length of 1.0 millimeter,
  t ranges from 70 micrometers to 100 micrometers, and
  t/T satisfies $0.10 \leq t/T \leq 0.14$.

3. The electronic component of claim 1, wherein the capacitor body has a length of 0.7 millimeter, t ranges from 60 micrometers to 90 micrometers, and t/T satisfies 0.13≤t/T≤0.20.

4. The electronic component of claim 1, wherein the capacitor body has a length of 0.5 millimeter,
t ranges from 50 micrometers to 80 micrometers, and t/T satisfies 0.17≤t/T≤0.27.

5. The electronic component of claim 1, wherein the adhesive layer is disposed between a bottom surface of the capacitor body and the top surface of the interposer body.

6. The electronic component of claim 1, wherein the adhesive layer includes an epoxy resin.

7. The electronic component of claim 1, wherein the external terminals have end portions having '[', and ']' shapes.

8. The electronic component of claim 1, wherein the interposer body includes alumina.

9. The electronic component of claim 1, wherein the capacitor body includes first and second surfaces opposing each other in a first direction, third and fourth surfaces opposing each other in a second direction and connected to the first and second surfaces, and fifth and sixth surfaces opposing each other in a third direction and connected to the first and second surfaces as well as the third and fourth surfaces, the capacitor body including a plurality of dielectric layers and a plurality of first and second internal electrodes alternately disposed with the dielectric layers interposed therebetween in the first direction, and
an end of each of the plurality of first internal electrodes and an end of each of the plurality of second internal electrodes are exposed through the third surface and the fourth surface, respectively.

10. The electronic component of claim 9, wherein the pair of external electrodes comprise:
head portions disposed on the third and fourth surfaces of the capacitor body, respectively; and
band portions extending from the head portions to portions of the first, second, fifth, or sixth surface of the capacitor body.

11. The electronic component of claim 10, wherein the adhesive layer extends to cover the band portions disposed on both sides of a bottom surface of the capacitor body, and extends to cover the bonding portions disposed on both sides of the top surface of the interposer body.

12. The electronic component of claim 9, wherein the ceramic body includes an active region which includes the plurality of first and second internal electrodes, and a cover region disposed on both side surfaces of the active region in the third direction and disposed on upper and lower surfaces of the active portion in the first direction.

13. The electronic component of claim 9, wherein lengths of the interposer body in the second and third directions are less than or equal to lengths of the capacitor body in the second and third directions, respectively.

14. The electronic component of claim 1, further comprising:
a plating layer disposed on surfaces of the external electrodes and surfaces of the external terminals.

15. The electronic component of claim 1, the electronic component having a length of 0.8 millimeter or less, a width of 0.4 millimeter or less, and a height of 0.7 millimeter or less.

16. An electronic component comprising:
a multilayer capacitor, including a capacitor body, and a pair of external electrodes disposed on both ends of the capacitor body, respectively;
an interposer, including an interposer body, and a pair of external terminals disposed on both ends of the interposer body, respectively; and
an adhesive layer disposed on facing boundaries of the multilayer capacitor and the interposer,
wherein the multilayer capacitor has a concave surface facing the interposer,
the adhesive layer is disposed between the concave surface of the multilayer capacitor and the interposer, and
0.1≤t/T≤0.3 in which dimension "t" is a maximum height of the adhesive layer and dimension "T" is a height of the electronic component.

17. The electronic component of claim 16, wherein the external terminals include bonding portions disposed on a top surface of the interposer body and connected to the external electrodes via the adhesive layer, respectively, mounting portions disposed on a bottom surface of the interposer body, and connection portions disposed on end surfaces of the interposer body to connect the bonding portions and the mounting portions to each other.

18. The electronic component of claim 16, wherein the adhesive layer includes an epoxy resin.

19. The electronic component of claim 16, wherein the interposer body includes alumina.

* * * * *